United States Patent
Kang et al.

(10) Patent No.: US 9,312,235 B1
(45) Date of Patent: Apr. 12, 2016

(54) ALUMINUM-BASED ALLOY CONDUCTIVE WIRE USED IN SEMICONDUCTOR PACKAGE AND MANUFACTURING METHOD THEREOF

(71) Applicant: METAL INDUSTRIES RESEARCH & DEVELOPMENT CENTRE, Kaohsiung (TW)

(72) Inventors: Ching-Shing Kang, Kaohsiung (TW); Sung-Wei Yeh, Kaohsiung (TW); Chin-Hsiang Shih, Kaohsiung (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 0 days.

(21) Appl. No.: 14/573,150

(22) Filed: Dec. 17, 2014

(51) Int. Cl.
*C22C 21/00* (2006.01)
*H01L 23/00* (2006.01)
*C22F 1/04* (2006.01)

(52) U.S. Cl.
CPC ............... *H01L 24/45* (2013.01); *C22C 21/00* (2013.01); *C22F 1/04* (2013.01); *H01L 24/43* (2013.01); *H01L 2224/432* (2013.01); *H01L 2224/43848* (2013.01); *H01L 2224/43985* (2013.01); *H01L 2224/45* (2013.01); *H01L 2924/013* (2013.01)

(58) Field of Classification Search
CPC .......... C22C 21/02; C22C 21/08; C22C 21/04
See application file for complete search history.

(56) References Cited

FOREIGN PATENT DOCUMENTS

CN        102360623 A   *   2/2012

\* cited by examiner

*Primary Examiner* — Rebecca Lee
(74) *Attorney, Agent, or Firm* — Jackson IPG PLLC; Demian K. Jackson

(57) ABSTRACT

An aluminum-based alloy conductive wire used in semiconductor package is composed of 0.05 to 0.14 weight percent scandium (Sc), 0.01 to 0.1 weight percent zirconium (Zr), 0.01 to 0.1 weight percent silicon (Si) and the balance aluminum (Al), wherein the aluminum-based alloy conductive wire is made from high purity aluminum, aluminum-scandium alloy, aluminum-zirconium alloy and aluminum-silicon alloy by a melting treatment, a casting treatment, a solution treatment, a plastic processing and an aging treatment.

4 Claims, 1 Drawing Sheet

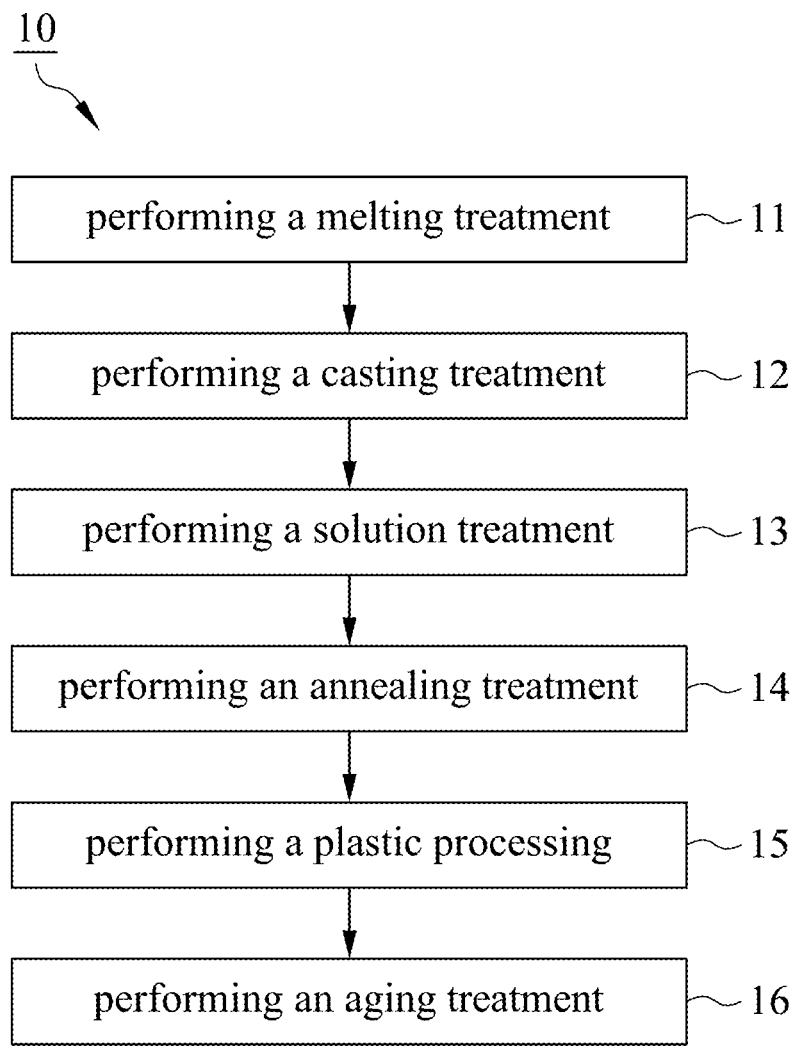

ALUMINUM-BASED ALLOY CONDUCTIVE WIRE USED IN SEMICONDUCTOR PACKAGE AND MANUFACTURING METHOD THEREOF

FIELD OF THE INVENTION

The present invention is generally relating to an aluminum-based alloy conductive wire used in semiconductor package. The present invention particularly relates to an aluminum-based alloy conductive wire used in semiconductor package has high heat-endurance and high conductivity.

BACKGROUND OF THE INVENTION

The material in conventional aluminum-based alloy conductive wire used in semiconductor package includes aluminum (Al), scandium (Sc) and zirconium (Zr). The manufacturing process of conventional aluminum-based alloy conductive wire is listed as followed: making scandium and zirconium uniformly dissolved into aluminum by a solution treatment and separating out the excessive-dissolved scandium (Sc) and zirconium (Zr) in aluminum (Al) by aging treatment for enhancing the hardness of conventional aluminum-based alloy conductive wire. However, the bonding energy between aluminum-scandium and aluminum-zirconium is too large to easily separate out scandium (Sc) and zirconium (Zr) in aluminum (Al), which results in incapability of meeting demand for the hardness of aluminum-based alloy conductive wire. Accordingly, increases the time of aging treatment and the addition level of scandium are necessary to meet demands on hardness of aluminum-based alloy conductive wire.

SUMMARY

The primary object of the present invention is to provide an aluminum-based alloy conductive wire used in semiconductor package, wherein the aluminum-based alloy conductive wire is composed of 0.05 to 0.14 weight percent scandium (Sc), 0.01 to 0.1 weight percent zirconium (Zr), 0.01 to 0.1 weight percent silicon (Si) and the balance aluminum (Al), wherein 0.01 to 0.1 weight percent silicon (Si) is used for breaking the bonding energy between aluminum-scandium and aluminum-zirconium and increasing the hardness of the aluminum-based alloy conductive wire to reduce the time of aging treatment and the addition level of scandium therefore lowering cost of manufacture.

DESCRIPTION OF THE DRAWINGS

FIG. 1 is a flow chart illustrating an aluminum-based alloy conductive wire used in semiconductor package in accordance with an embodiment of the present invention.

DETAILED DESCRIPTION OF THE INVENTION

The present invention provides an aluminum-based alloy conductive wire used in semiconductor package with high heat-endurance and conductivity, wherein the aluminum-based alloy conductive wire is composed of 0.05 to 0.14 weight percent scandium, 0.01 to 0.1 weight percent zirconium, 0.01 to 0.1 weight percent silicon and the balance aluminum. The aluminum-based alloy conductive wire reaches over 60% IACS of conductivity and over 50 HV of hardness (Vickers hardness). Besides, the aluminum-based alloy conductive wire is still operative at temperatures below 200 degrees Celsius. In this embodiment, the aluminum-based alloy conductive wire is composed of 0.1 weight percent scandium, 0.05 weight percent zirconium, 0.06 weight percent silicon and the balance aluminum. The conductivity value of aluminum-based alloy conductive wire reaches 60.2% IACS and the Vickers hardness value of aluminum-based alloy conductive wire reaches 59.3 HV.

Referring to FIG. 1, a manufacturing method 10 for the aluminum-based alloy conductive wire includes: performing a melting treatment 11; performing a casting treatment 12; performing a solution treatment 13; performing an annealing treatment 14; performing a plastic processing 15; and performing an aging treatment 16.

With reference to FIG. 1, in the step 11 of performing a melting treatment, high purity aluminum, aluminum-scandium alloy, aluminum-zirconium alloy and aluminum-silicon alloy are melted to be an aluminum-based alloy solvent, wherein the temperature of melting treatment is 720 to 780 degrees Celsius. The slag is removed from the aluminum-based alloy solvent to remove undesired impurities in the aluminum-based alloy solvent after the melting treatment. Thereafter, the aluminum-based alloy solvent is stirred uniformly before pouring out from an oven, wherein the tapping temperature is 750 degrees Celsius. In this embodiment, the high purity aluminum is selected from 5N aluminum.

With reference to FIG. 1, performing the casting treatment after the step 11 of performing the melting treatment, in the step 12 of performing the casting treatment, the aluminum-based alloy solvent is made to be an aluminum-based alloy material in the casting treatment. In this embodiment, the aluminum-based alloy material is an ingot with 76 to 100 mm diameter.

With reference to FIG. 1, performing the solution treatment after the step 12 of performing the casting treatment, in the step 13 of performing the solution treatment, the aluminum-based alloy material is performed the solution treatment at 600 to 650 degrees Celsius over 12 hours to make scandium, zirconium and silicon in the aluminum-based alloy material uniformly dissolved into aluminum. An aluminum-based alloy rod is formed from the aluminum-based alloy material by hot extruding after the solution treatment, wherein the diameter of the aluminum-based alloy rod is 5 to 20 mm. In this embodiment, the aluminum-based alloy material is performed the solution treatment at 645 degrees Celsius for 24 hours, and the aluminum-based alloy material is formed the aluminum-based alloy rod with diameter of about 5 mm by heat extruding at 250 to 300 degrees Celsius.

With reference to FIG. 1, performing the annealing treatment after the step 13 of performing the solution treatment, in the step 14 of performing the annealing treatment, the aluminum-based alloy rod made by heat extruding is performed the annealing treatment at 250 to 500 degrees Celsius for 5 to 72 hours.

With reference to FIG. 1, performing the plastic processing after the step 14 of performing the annealing treatment, wherein in the step 15 of performing the plastic processing, the aluminum-based alloy rod is processed to be an aluminum-based alloy wire stock, wherein the Vickers hardness of aluminum-based alloy wire stock reaches 25 to 35 HV. The aluminum-based alloy rod may be processed to be the aluminum-based alloy wire stock by means of extrusion, extension or drawing. In this embodiment, the aluminum-based alloy rod is made to be the aluminum-based alloy wire stock with diameters of 0.03 to 1 mm by cool drawing, and the Vickers hardness of aluminum-based alloy wire stock reaches 30HV.

With reference to FIG. 1, performing the aging treatment after the step 15 of performing the plastic processing, in the step 16 of performing the aging treatment, the aluminum-based alloy wire stock is performed the aging treatment at temperatures above 275 degrees Celsius for 3 to 10 hours to convert the aluminum-based alloy wire stock into an aluminum-based alloy conductive wire. In this embodiment, the aluminum-based alloy wire stock is performed the aging treatment at 300 degrees Celsius for 3 hours, wherein the aluminum-based alloy conductive wire is composed of 0.05 to 0.14 weight percent scandium, 0.01 to 0.1 weight percent zirconium, 0.01 to 0.1 weight percent silicon and the balance aluminum. In this embodiment, the aluminum-based alloy conductive wire is composed of 0.10 weight percent scandium, 0.05 weight percent zirconium, 0.06 weight percent silicon and the balance aluminum.

Referring to a chart below, various metal contents of aluminum-based alloy conductive wires with silicon and aluminum-based alloy conductive wires without silicon are performed the solution treatment and the aging treatment respectively, wherein high scandium contents of aluminum-based alloy conductive wire without silicon (#1) is composed of 0.15 weight percent scandium, 0.05 weight percent zirconium and the balance aluminum, low scandium contents of aluminum-based alloy conductive wire without silicon (#2) is composed of 0.10 weight percent scandium, 0.05 weight percent zirconium and the balance aluminum, low scandium contents of aluminum-based alloy conductive wire with silicon (#3) is composed of 0.10 weight percent scandium, 0.05 weight percent zirconium, 0.03 weight percent silicon and the balance aluminum, low scandium contents of aluminum-based alloy conductive wire with silicon (#4) is composed of 0.10 weight percent scandium, 0.05 weight percent zirconium, 0.06 weight percent silicon and the balance aluminum and medium scandium contents of aluminum-based alloy conductive wire with silicon (#5) is composed of 0.12 weight percent scandium, 0.05 weight percent zirconium, 0.03 weight percent silicon and the balance aluminum. The aluminum-based alloy conductive wires with silicon and the aluminum-based alloy conductive wires without silicon were performed the solution treatment at 645 degrees Celsius for 24 hours and performed the aging treatment in 300 degrees Celsius for 3 hours respectively. The Vickers hardness of the aluminum-based alloy conductive wire with silicon (#3 and #4) is larger than the aluminum-based alloy conductive wire without silicon (#2) as illustrated in mentioned chart. Besides, the Vickers hardness of medium scandium contents of aluminum-based alloy conductive wire with Silicon (#5) is larger than high scandium contents of aluminum-based alloy conductive wire without silicon (#1). Accordingly, the silicon in the aluminum-based alloy conductive wire of the present invention can reduce the time of the aging treatment or the addition level of scandium to reduce cost of manufacture and keep the high heat resistance and the high conductivity of the aluminum-based alloy conductive wire simultaneously.

|    |                       | Conductivity (IACS) | Vickers Hardness (HV) |
|----|-----------------------|---------------------|-----------------------|
| #1 | Al-0.15Sc-0.05Zr      | 58.5                | 53.22                 |
| #2 | Al-0.10Sc-0.05Zr      | 59.1                | 40.62                 |
| #3 | Al-0.10Sc-0.05Zr-0.03Si | 60.8              | 56.33                 |
| #4 | Al-0.10Sc-0.05Zr-0.06Si | 60.2              | 59.35                 |
| #5 | Al-0.12Sc-0.05Zr-0.03Si | 60.0              | 66.37                 |

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. An aluminum-based alloy conductive wire used in semiconductor package consisting of 0.05 to 0.14 weight percent scandium (Sc), 0.01 to 0.1 weight percent zirconium (Zr), 0.01 to 0.1 weight percent silicon (Si) and the balance aluminum (Al).

2. The aluminum-based alloy conductive wire used in semiconductor package in accordance with claim 1, wherein the aluminum-based alloy conductive wire is operative at temperatures below 200 degrees Celsius.

3. The aluminum-based alloy conductive wire used in semiconductor package in accordance with claim 1, wherein the conductivity value of the aluminum-based alloy conductive wire is over 60% IACS.

4. The aluminum-based alloy conductive wire used in semiconductor package in accordance with claim 1, wherein the Vickers hardness value of the aluminum-based alloy conductive wire is over 50 HV.

\* \* \* \* \*